United States Patent
Xie

(10) Patent No.: US 9,555,611 B2
(45) Date of Patent: Jan. 31, 2017

(54) LASER STRIPPING APPARATUS

(71) Applicant: BOE Technology Group Co., Ltd., Beijing (CN)

(72) Inventor: Chunyan Xie, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 163 days.

(21) Appl. No.: 14/518,416

(22) Filed: Oct. 20, 2014

(65) Prior Publication Data

US 2015/0375494 A1   Dec. 31, 2015

(30) Foreign Application Priority Data

Jun. 25, 2014   (CN) .......................... 2014 2 0344154

(51) Int. Cl.
   *B32B 38/10*   (2006.01)
   *B32B 43/00*   (2006.01)
   *H01L 51/00*   (2006.01)

(52) U.S. Cl.
   CPC ........ *B32B 43/006* (2013.01); *B32B 2457/206* (2013.01); *H01L 51/003* (2013.01); *H01L 51/0097* (2013.01); *H01L 2221/68386* (2013.01); *Y10S 156/93* (2013.01); *Y10S 156/941* (2013.01); *Y10T 156/1132* (2015.01); *Y10T 156/1158* (2015.01); *Y10T 156/1917* (2015.01); *Y10T 156/1944* (2015.01)

(58) Field of Classification Search
   None
   See application file for complete search history.

(56) References Cited

U.S. PATENT DOCUMENTS

| | | | | |
|---|---|---|---|---|
| 5,285,045 A * | 2/1994 | Ito | ........................ | B23K 26/06 219/121.76 |
| 6,303,902 B1 * | 10/2001 | Nakai | .................... | B23K 26/14 219/121.6 |
| 6,998,008 B2 * | 2/2006 | Kwan | ............... | B29C 66/73921 156/272.8 |
| 7,005,602 B1 * | 2/2006 | Howell | .................. | B23K 26/04 219/121.69 |
| 8,101,490 B2 * | 1/2012 | Ando | ..................... | B32B 38/10 257/E21.006 |
| 8,317,508 B2 * | 11/2012 | Bokodi | ................... | B29C 35/02 264/497 |
| 8,986,497 B2 * | 3/2015 | Sercel | ................ | B32B 38/0008 156/712 |
| 2013/0084459 A1 * | 4/2013 | Larson | ...................... | C09J 4/00 428/422 |

(Continued)

*Primary Examiner* — Mark A Osele
(74) *Attorney, Agent, or Firm* — Westman, Champlin & Koehler, P.A.

(57) ABSTRACT

Embodiments of the present invention provide a laser stripping apparatus, comprising: a frame; a laser located above the frame and a carrier stage located below the frame; a support mechanism provided on the carrier stage for carrying a flexible display substrate stripping plate; wherein the support mechanism is removably fixed to the carrier stage; the flexible display substrate stripping plate comprises a bearing substrate and a flexible display substrate provided on the bearing substrate; and when the flexible display substrate stripping plate is provided on the laser stripping apparatus, the flexible display substrate comes into contact with the support mechanism.

9 Claims, 3 Drawing Sheets

(56) References Cited

U.S. PATENT DOCUMENTS

2013/0248503 A1* 9/2013 Lee .................. B23K 31/02
219/121.72
2014/0332150 A1* 11/2014 Hirakata ............. B32B 38/10
156/247

* cited by examiner

LASER STRIPPING APPARATUS

CROSS-REFERENCE TO RELATED APPLICATION

This application claims the benefit of Chinese Patent Application No. CN201420344154.8 filed on Jun. 25, 2014 in the State Intellectual Property Office of China, the whole disclosure of which is incorporated herein by reference.

BACKGROUND OF THE INVENTION

Field of the Invention

Embodiments of the present invention generally relate to a laser stripping apparatus.

Description of the Related Art

In prior arts, a method of manufacturing a flexible OLED display generally includes following steps: forming a flexible substrate on a rigid substrate, forming OLED display elements on the flexible substrate, stripping the flexible substrate from the rigid substrate by using a laser irradiation scanning method, thereby obtaining the flexible OLED display.

In the step of stripping the flexible substrate from the rigid substrate by using the laser irradiation scanning method, the rigid substrate and the flexible substrate thereon need be turned over wholly so that the rigid substrate faces upwards, next, laser is scanned above and irradiated onto the rigid substrate, and focused on a contact surface between the rigid substrate and the flexible substrate so as to damage adhesion of the contact surface, and then the flexible substrate is stripped from the rigid substrate by using a mechanical separation method. In this case, however, on one hand, since the flexible substrate is located below the rigid substrate after being turned over and will directly contact with a carrier stage of a laser stripping apparatus the flexible substrate will be damaged due to factors such as design of the carrier stage, material and the like; on the other hand, since the adhesion between the flexible substrate and the rigid substrate is very weak after being irradiated by the laser, the flexible substrate will easily fall off from the rigid substrate when being carried to a next step for the mechanical separation, thereby adversely affect yield of the flexible substrate.

SUMMARY OF THE INVENTION

In order to solve the above and other problems in prior arts, an object of embodiments of the present invention is to provide a laser stripping apparatus, which is capable of avoiding damage to the flexible display substrate and preventing the flexible display substrate from falling off.

In order to achieve the above object, embodiments of the present invention provide following technical solutions:

A laser stripping apparatus comprises:

a frame;

a laser located above the frame and a carrier stage located below the frame;

a support mechanism provided on the carrier stage for carrying a flexible display substrate stripping plate;

wherein the support mechanism is removably fixed to the carrier stage;

the flexible display substrate stripping plate comprises a bearing substrate and a flexible display substrate provided on the bearing substrate; and when the flexible display substrate stripping plate is provided on the laser stripping apparatus, the flexible display substrate contacts with the support mechanism.

BRIEF DESCRIPTION OF THE DRAWINGS

The above and other features of the present invention will become more apparent by describing in detail exemplary embodiments thereof with reference to the accompanying drawings, in which.

LIST OF REFERENCE NUMBERS

Figure 1:
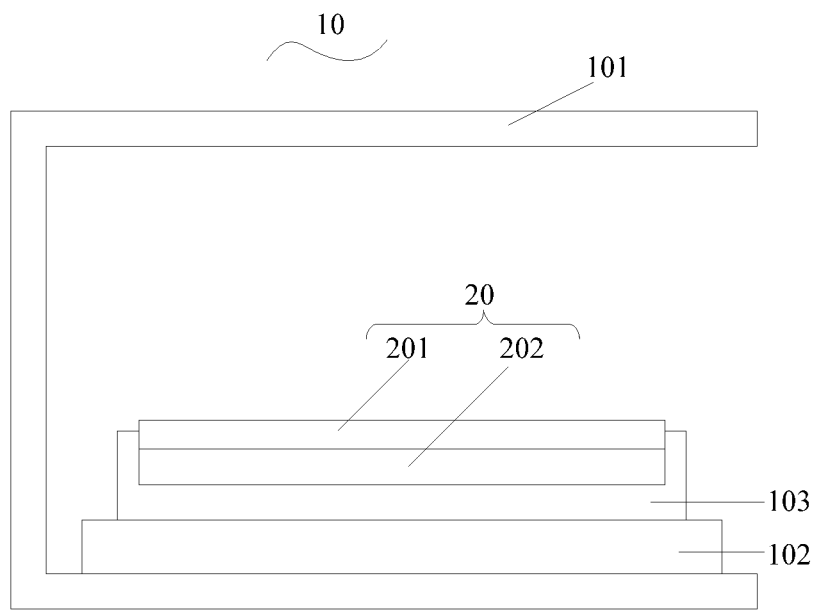
FIG. 1 is a schematic structural view of a laser stripping apparatus according to an embodiment of the present invention.

10—laser stripping apparatus; 101—frame; 102—carrier stage; 103—support mechanism; 1031—bottom surface; 10311—first vacuum hole; 1031a—first bottom surface; 1031b—first portion; 1031c—second portion; 1032—side surface; 1033—guide rail; 1033a—first small hole; 20—flexible display substrate stripping plate; 201—bearing substrate; 202—flexible display substrate; 30—splice plate.

DETAILED DESCRIPTION OF PREFERRED EMBODIMENTS OF THE INVENTION

Exemplary embodiments of the present disclosure will be described hereinafter in detail with reference to the attached drawings In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In a general inventive concept, embodiments of the present invention provide a laser stripping apparatus, comprising: a frame; a laser located above the frame and a carrier stage located below the frame; a support mechanism provided on the carrier stage for carrying a flexible display substrate stripping plate; wherein the support mechanism is removably fixed to the carrier stage; the flexible display substrate stripping plate comprises a bearing substrate and a flexible display substrate provided on the bearing substrate; and when the flexible display substrate stripping plate is provided on the laser stripping apparatus, the flexible display substrate contacts with the support mechanism.

Embodiments of the present invention provide a laser stripping apparatus 10 as shown in FIG. 1, the laser stripping apparatus 10 comprises a frame 101, a laser (not shown in the figure) located above the frame and a carrier stage 102 located below the frame. The laser stripping apparatus 10 further comprises a support mechanism 103 provided on the carrier stage 102 for carrying a flexible display substrate stripping plate 20.

The support mechanism 103 may be removably fixed to the carrier stage 102, the flexible display substrate stripping plate 20 may comprise a bearing substrate 201 and a flexible display substrate 202 provided on the bearing substrate. When the flexible display substrate stripping plate 20 is arranged on the laser stripping apparatus 10, the flexible display substrate 202 comes into contact with the support mechanism 103.

When the flexible display substrate 202 is an array substrate of a liquid crystal display, the flexible display substrate 202 may include, for example, a flexible substrate, and thin film transistors, pixel electrodes and the like provided on the flexible substrate. When the flexible display substrate 202 is a color filter substrate of the liquid crystal display, the flexible display substrate 202 may include, for example, a flexible substrate, and red, green or blue photoresist, a black matrix, common electrodes and the like provided on the flexible substrate. When the flexible display substrate 202 is a display panel of the liquid crystal display, the flexible display substrate 202 may include, for example, the array substrate and the color filter substrate as described above. When the flexible display substrate 202 is used in an organic light emitting diode display, the flexible display substrate 202 may include, for example, a flexible substrate and thin film transistors, anodes, a luminescent layer, cathodes, an encapsulation layer and the like provided on the flexible substrate.

However, the above flexible display substrate 202 may also include IC, and so on.

It is noted that first, since the support mechanism 103 is removably fixed to the carrier stage 102, and before stripping the flexible substrate from the bearing substrate 201 by using the laser irradiation scanning method, the bearing substrate 201 and the flexible display substrate 202 on the bearing substrate 201 need to be turned over wholly so that the bearing substrate 201 face upwards, in embodiments of the present invention, the flexible display substrate stripping plate 20 may be turned over firstly to be placed in the support mechanism 103, and then the support mechanism 103 together with the flexible display substrate stripping plate 20 are conveyed onto the carrier stage 102 of the laser stripping apparatus to be scanned and irradiated by the laser.

Second, the support mechanism 103 is not limited in structure, as long as the support mechanism 103 can support the flexible display substrate stripping plate 20, and during scanning and irradiating the flexible display substrate stripping plate 20 by the laser, the flexible display substrate stripping plate 20 will not be moved relative to the support mechanism 103.

In such a case, it is not limited that the support mechanism 103 only supports the flexible display substrate stripping plate 20 of one size, rather, the support mechanism 103 may be adapted to various sizes of flexible display substrate stripping plates 20.

For example, the support mechanism 103 may be divided into regions each being capable of supporting a flexible display substrate stripping plate 20 of one size.

Third, the support mechanism 103 according to embodiments of the present invention may be adjusted based on size, shape, material and the like of the flexible display substrate stripping plate 20 to be stripped, so that the laser stripping apparatus 10 may be suitable for stripping random product models of flexible display substrates 202 and bearing substrates 201.

Fourth, the flexible display substrate stripping plate 20 according to embodiments of the present invention may be consisted of the bearing substrate 201 and a plurality of flexible display substrates 202 provided on the bearing substrate 201, or may be consisted of the bearing substrate 201 and one flexible display substrate 202 provided on the bearing substrate 201, which is not limited here.

Because the support mechanism 103 is removably fixed to the carrier stage 102, on one hand, support mechanisms 103 having various shapes, sizes and materials may be designed according to different product models of flexible display substrates 202, and thus when the flexible display substrate 202 is stripped from the bearing substrate 201, the flexible display substrate 202 can be prevented from being damaged due to design of the carrier stage, materials and the like; on the other hand, after being irradiated by the laser, the bearing substrate 201 and the flexible display substrate 202 with weak adhesion therebetween, together with the support mechanism 103, may be conveyed to next step for a mechanical separation, which can avoid the yield of the flexible display substrate 202 from being affected due to falling off of the flexible display substrate 202 during conveying.

Figure 2:
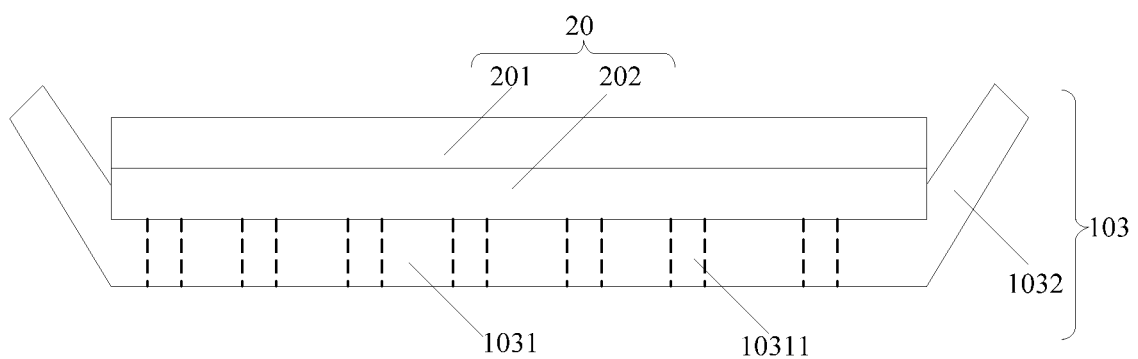
FIG. 2 is a schematic structural view of a support mechanism according to an embodiment of the present invention.

As shown in FIG. 2, the support mechanism 103 comprises a bottom surface 1031, which comprises a plurality of first vacuum holes 10311 extending through the bottom surface 1031.

Here, the bottom surface 1031 of the support mechanism 103 is a surface to contact with the carrier stage 102.

In such a case, the carrier stage 102 comprises a plurality of second vacuum holes (not shown in the figure) each corresponding to respective one of the plurality of first vacuum holes 10311. The second vacuum holes in the carrier stage 102 may be manufactured by corresponding processes, or may be achieved by manufacturing the carrier stage 102 with a porous material.

As such, the first vacuum holes 10311 located in the bottom surface 1031 of the support mechanism 103 are in communication with the respective second vacuum holes in the carrier stage 102, so that the flexible display substrate stripping plate 20 on the support mechanism 103 can be suctioned.

Figure 3:
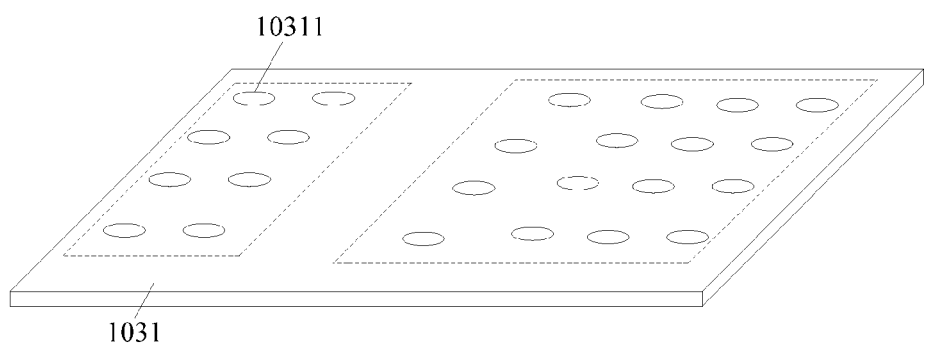
FIG. 3 is a schematic structural view of a bottom surface of the support mechanism shown in FIG. 2.

It is noted that as shown in FIG. 3, the bottom surface 1031 of the support mechanism 103 may be provided to have a larger area, and the first vacuum holes 10311 are provided in regions of different sizes so as to suction the flexible display substrate stripping plate 20 located in the respective regions, thus the support mechanism 103 may be suitable for various sizes of flexible display substrate stripping plates 20. When a region of the bottom surface having a first size is used, the first vacuum holes 10311 located in other regions of the bottom surface are sealed by for example a sealing membrane.

Further, considering that if sizes of the first vacuum holes 10311 are too large, a local suction force may be too large, while the flexible display substrate 202 itself is very thin, which may result in damages to internal circuitries of the display substrate 202 or whole of the display substrate, thus in one embodiment of the present invention, a diameter of the first vacuum holes is smaller than 1 mm.

In one embodiment of the present invention as shown in FIG. 2, the support mechanism 103 further comprises two opposite side surfaces 1032 connected with the bottom surface 1031.

In this embodiment, when a flexible display substrate stripping plate 20 of a particular size is exactly placed in the support mechanism 103, the two opposite side surfaces 1032 contact with side surfaces of the flexible display substrate 202, the flexible display substrate stripping plate 20 can be further fixed, thereby the flexible display substrate 202 can be avoided from being damaged due to relative sliding of the flexible display substrate stripping plate 20 with respect to the support mechanism 103 during conveying the flexible display substrate stripping plate 20 together with the support mechanism 103.

It is noted that, since the two opposite side surface 1032 are brought to contact with the side surfaces of the flexible display substrate 202, while one object of the present invention is to avoid damages to the flexible display substrate 202, the design in which the two opposite side surfaces 1032 of the support mechanism 103 contact with the side surfaces of the flexible display substrate 202 will not lead to any damage to the flexible display substrate 202.

In one embodiment of the present invention, the support mechanism 103 further comprises an adjustment means (not shown in figures) for adjusting angles between the two opposite side surfaces 1032 and the bottom surface 1031.

The adjustment means may be provided at a position where either one of the side surfaces 1032 is connected with the bottom surface 1031, so that the flexible display substrate stripping plate 20 may be firstly turned over and placed on the bottom surface 1031 of the support mechanism 103 and then the adjustment means is adjusted to achieve a suitable angle of the side surfaces 1032 of the support mechanism 103 relative to the bottom surface 1031, thereby fixing the flexible display substrate stripping plate 20 through the side surfaces 1032.

Figure 4:
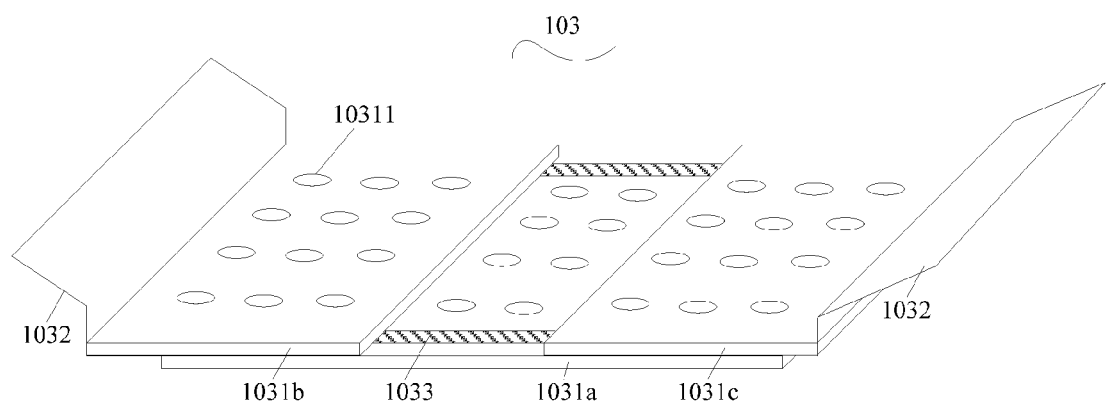
FIG. 4 is a schematic structural view of another support mechanism according to an embodiment of the present invention.

In one embodiment of the present invention as shown in FIG. 4, the bottom surface 1031 comprises a first bottom surface 1031a and a second bottom surface which comprises a first portion 1031b and a second portion 1031c, and the two opposite side surfaces 1032 are connected with the first portion 1031b and the second portion 1031c respectively.

Guide rails 1033 are provided on the first bottom surface 1031a, and the first portion 1031b and the second portion 1031c of the second bottom surface are connected with the first bottom surface 1031a through sliders (not shown in figures) mating with the guide rails 1033.

Thus, by sliding the first portion 1031b and/or the second portion 1031c, a region surrounded by the first portion 1031b, the second portion 1031c and the two opposite side surface 1032 may be enlarge in area, so that the support mechanism 103 may be adapted to various product models of flexible display substrates 202.

It is noted that firstly, when sliding the first portion 1031b and/or the second portion 1031c, the first portion 1031b needs to be spaced from the second portion 1031c by a suitable distance to make sure that the first portion 1031b and the second portion 1031c can support and carry the flexible display substrate stripping plate 20.

Second, when sliding the first portion 1031b and/or the second portion 1031c in place, it needs be ensured that vacuum holes in the first portion 1031b and the second portion 1031c of the second bottom surface and the first vacuum holes 10311 in first bottom surface 1031a extend through the bottom surface 1031.

Figure 5:
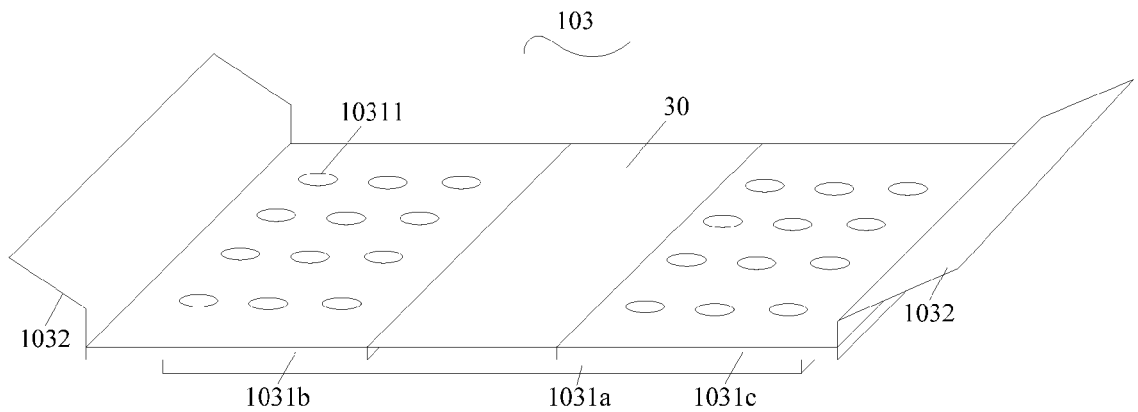
FIG. 5 is a schematic structural view of a further support mechanism according to an embodiment of the present invention.

In one embodiment of the present invention as shown in FIG. 5, with a spacing between the first portion 1031b and the second portion 1031c of the second bottom surface, the support mechanism 103 further comprises a splice plate 30 arranged between the first portion 1031b and the second portion 1031c.

The splice plate 30 contacts with both of the first portion 1031b and the second portion 1031c, and an upper surface of the splice plate 30 is in the same plane as upper surfaces of the first portion 1031b and the second portion 1031c.

Here, the splice plate 30 may be also connected with the guide rails 1033 provided on the first bottom surface 1031a, for example, by sliders.

As such, on one hand, the flexible display substrate 202 can be avoided from being deformed due to the spacing between the first portion 1031b and the second portion 1031c, and on the other hand, vacuum absorption effect can be prevented from being reduced due to entering of air between parts of the flexible display substrate 202 and the first portion 1031b and the second portion 1031c which do not contact with each other.

In one embodiment of the present invention, the first portion 1031b and the second portion 1031c are arranged to be equal to each other in area. In such a case, when the first portion 1031b is spaced away from the second portion 1031c by a distance, since a contact area between the first portion 1031b and the flexible display substrate 202 of the flexible display substrate stripping plate 20 is equal to that between the second portion 1031c and the flexible display substrate 202 of the flexible display substrate stripping plate 20, the flexible display substrate stripping plate 20 can be supported in a balanced manner.

Figure 6:
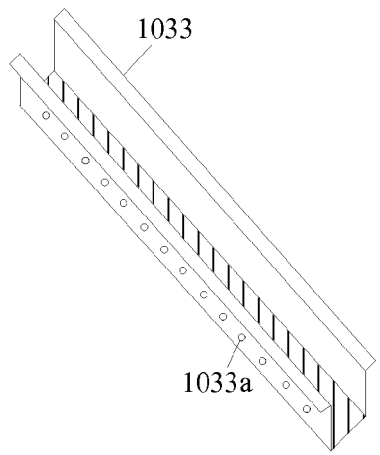
FIG. 6 is a schematic structural view of guide rails provided on a first bottom surface according to an embodiment of the present invention.

In one embodiment of the present invention as shown in FIGS. 4 and 6, the guide rails 1033 are provided at edges of the first bottom surface 1031a, and a plurality of first small holes 1033a are provided in side surfaces of the guide rails 1033 perpendicular to the first bottom surface 1031a; and side surfaces of the sliders perpendicular to the first bottom surface 1031a are provided therein with a plurality of second small holes each corresponding to respective one of the plurality of first small holes.

As such, according to various models of flexible display substrates 202, when the first portion 1031b and/or the second portion 1031c is slid to a position, the first portion 1031b and the second portion 1031c can be fixed in place by inserting a fixing bar into a first small hole 1033a and its corresponding second small hole, thereby the flexible display substrate 202 can be avoided from being damaged due to sliding of the flexible display substrate stripping plate 20 caused by sliding movement of the first portion 1031b and the second portion 1031c during conveying the flexible display substrate stripping plate 20.

Although several exemplary embodiments have been shown and described, it would be appreciated by those skilled in the art that various changes or modifications may be made in these embodiments without departing from the principle and spirit of the disclosure, the scope of which is defined in the claims and their equivalents.

What is claimed is:

1. A laser stripping apparatus, comprising:
a frame;
a laser located above the frame and a carrier stage located below the frame; and
a support mechanism provided on the carrier stage for carrying a flexible display substrate stripping plate;
wherein the support mechanism is removably fixed to the carrier stage;
the flexible display substrate stripping plate comprises a bearing substrate and a flexible display substrate provided on the bearing substrate; and when the flexible display substrate stripping plate is provided on the laser stripping apparatus, the flexible display substrate comes into contact with the support mechanism, wherein the support mechanism comprises a bottom surface, which comprises a plurality of first vacuum holes extending through the bottom surface; and the carrier stage comprises a plurality of second vacuum holes each corresponding to respective one of the plurality of first vacuum holes;

wherein the support mechanism further comprises two opposite side surfaces connected with the bottom surface; and wherein the two opposite side surfaces are configured to contact with and to fix side surfaces of the flexible display substrate.

2. The laser stripping apparatus according to claim 1, wherein a diameter of the first vacuum holes is smaller than 1 mm.

3. The laser stripping apparatus according to claim 1, wherein, the support mechanism further comprises an adjustment means for adjusting angles between the two opposite side surfaces and the bottom surface.

4. The laser stripping apparatus according to claim 1, wherein the bottom surface comprises a first bottom surface and a second bottom surface comprising a first portion and a second portion, and the two opposite side surfaces are connected with the first portion and the second portion respectively;

guide rails are provided on the first bottom surface, and the first portion and the second portion of the second bottom surface are connected with the first bottom surface through sliders; and the guide rails mate with the sliders.

5. The laser stripping apparatus according to claim 4, wherein, when there is a spacing between the first portion and the second portion of the second bottom surface, the support mechanism further comprises a splice plate arranged between the first portion and the second portion; and the splice plate contacts with both of the first portion and the second portion, and an upper surface of the splice plate is in the same plane as upper surfaces of the first portion and the second portion.

6. The laser stripping apparatus according to claim 5, wherein the guide rails are provided at edges of the first bottom surface, and a plurality of first small holes are provided in side surfaces of the guide rails perpendicular to the first bottom surface; and side surfaces of the sliders perpendicular to the first bottom surface are provided therein with a plurality of second small holes each corresponding to respective one of the plurality of first small holes.

7. The laser stripping apparatus according to claim 4, wherein the first portion and the second portion have the same area.

8. The laser stripping apparatus according to claim 7, wherein the guide rails are provided at edges of the first bottom surface, and a plurality of first small holes are provided in side surfaces of the guide rails perpendicular to the first bottom surface; and side surface of the sliders perpendicular to the first bottom surface are provided therein with a plurality of second small holes each corresponding to respective one of the plurality of first small holes.

9. The laser stripping apparatus according to claim 4, wherein the guide rails are provided at edges of the first bottom surface, and a plurality of first small holes are provided in side surfaces of the guide rails perpendicular to the first bottom surface; and side surfaces of the sliders perpendicular to the first bottom surface are provided therein with a plurality of second small holes each corresponding to respective one of the plurality of first small holes.

* * * * *